(12) United States Patent
Zia et al.

(10) Patent No.: US 8,722,519 B2
(45) Date of Patent: May 13, 2014

(54) INTEGRATED ASSIST FEATURES FOR EPITAXIAL GROWTH

(75) Inventors: Omar Zia, Austin, TX (US); Ruiqi Tian, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/182,568

(22) Filed: Jul. 14, 2011

(65) Prior Publication Data

US 2011/0269300 A1 Nov. 3, 2011

Related U.S. Application Data

(62) Division of application No. 11/650,253, filed on Jan. 4, 2007, now Pat. No. 8,003,539.

(51) Int. Cl.
*H01L 27/07* (2006.01)

(52) U.S. Cl.
USPC ............. 438/479; 438/488; 257/E21.09

(58) Field of Classification Search
USPC .................. 438/479, 488; 257/E21.09
See application file for complete search history.

(56) References Cited

U.S. PATENT DOCUMENTS

| | | | |
|---|---|---|---|
| 5,278,105 A | 1/1994 | Eden et al. | |
| 6,093,631 A | 7/2000 | Jaso et al. | |
| 6,314,021 B1 | 11/2001 | Maeda et al. | |
| 6,323,113 B1 | 11/2001 | Gabriel et al. | |
| 6,593,226 B2 | 7/2003 | Travis et al. | |
| 6,611,045 B2 | 8/2003 | Travis et al. | |
| 6,614,062 B2 | 9/2003 | Chheda et al. | |
| 6,764,919 B2 | 7/2004 | Yu et al. | |
| 6,905,967 B1 | 6/2005 | Tian et al. | |
| 6,948,146 B2 | 9/2005 | Allen et al. | |
| 6,972,478 B1 | 12/2005 | Waite et al. | |
| 7,103,863 B2 | 9/2006 | Riepe et al. | |
| 7,393,730 B2 | 7/2008 | Hsu et al. | |
| 7,470,624 B2 | 12/2008 | Zia et al. | |
| 2005/0097490 A1 | 5/2005 | Travis et al. | |
| 2005/0133832 A1 | 6/2005 | Murthy et al. | |
| 2006/0073646 A1 | 4/2006 | Yang | |
| 2008/0166859 A1 | 7/2008 | Zia et al. | |

*Primary Examiner* — Jarrett Stark

(74) *Attorney, Agent, or Firm* — Jackson Walker L.L.P.

(57) ABSTRACT

A method for making a semiconductor device is provided which comprises (a) creating a data set (301) which defines a set of tiles for a polysilicon deposition process; (b) deriving a polysilicon deposition mask set (311) from the data set, wherein the polysilicon deposition mask set includes a plurality of polysilicon tiles (303); (c) deriving an epitaxial growth mask set (321) from the data set, wherein the epitaxial growth mask set includes a plurality of epitaxial tiles (305); and (d) using the polysilicon deposition mask set and the epitaxial growth mask set to make a semiconductor device (331); wherein the epitaxial growth mask set is derived from the data set by using at least a portion of the tile pattern defined in the data set for at least a portion of the tile pattern defined in the epitaxial deposition mask set.

17 Claims, 6 Drawing Sheets

INTEGRATED ASSIST FEATURES FOR EPITAXIAL GROWTH

CROSS-REFERENCE TO RELATED APPLICATIONS

This application is a divisional application and claims priority to commonly assigned U.S. Ser. No. 11/650,253 (Zia et al.), filed Jan. 4, 2007 U.S. Pat. No. 8,003,539, now allowed, entitled "Integrated Assist Features for Epitaxial Growth", and which is incorporated herein by reference in its entirety.

FIELD OF THE DISCLOSURE

The present application relates generally to semiconductor fabrication processes and, more particularly, to semiconductor fabrication processes in which structural tiles are selectively incorporated into one or more layers of the device to improve process uniformity.

BACKGROUND OF THE DISCLOSURE

The characteristics of certain semiconductor fabrication processes are found to vary considerably from one device to another. For example, the rate and uniformity of chemical mechanical planarization (CMP) techniques employed in conjunction with shallow trench isolation (STI) processes varies considerably as a function of feature pattern density. As a result, the application of such trench CMP processes to substrates that contain active regions of different population densities can give rise to significant and undesirable non-uniformities in topography.

This problem is sometimes addressed through the incorporation of dummy features or "tiles" into less populated active regions of a semiconductor device so as to even out the pattern density between the two regions, thereby achieving greater process uniformity in the trench CMP process. Such dummy features or tiles are typically placed in the "white space" between active device features, and are thus independent of the circuit design of the semiconductor device.

The characteristics of epitaxial growth processes are also found to vary significantly with pattern density. For example, when epitaxial growth processes are used to form silicon germanium alloy films on CMOS substrates, the growth rate, quality, composition and thickness of the resulting films are all highly sensitive to pattern density.

Some attempts have been made in the art to compensate for the effect of pattern density on epitaxial growth. For example, in one known approach, a fraction of the active tiles used to control topographical uniformity in the chemical mechanical polishing (CMP) attendant to shallow trench isolation (STI) are reused for density matching in subsequent epitaxial growth processes. However, this approach is found to produce suboptimal results in terms of compensating for differences in pattern densities during epitaxy.

There is thus a need in the art for a process which overcomes the aforementioned infirmities. In particular, there is a need in the art for a tiling scheme which addresses the needs of epitaxy independent of the needs of trench CMP. These and other needs may be addressed with the methodologies and devices described herein.

BRIEF DESCRIPTION OF THE DRAWINGS

The devices and methodologies disclosed herein are illustrated by way of example and are not limited by the accompanying figures, in which like references indicate similar elements. Elements in the figures are illustrated for simplicity and clarity and have not necessarily been drawn to scale.

DETAILED DESCRIPTION

Figure 1:
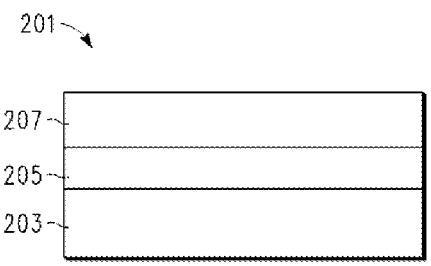
FIG. 1 is an illustration of a step in a semiconductor fabrication process in accordance with the teachings herein.

In one aspect, a method for making a semiconductor device is provided which comprises (a) creating a data set which defines a set of tiles for a polysilicon deposition process; (b) deriving a polysilicon deposition mask set from the data set, wherein the polysilicon deposition mask set includes a plurality of polysilicon tiles; (c) deriving an epitaxial growth mask set from the data set, wherein the epitaxial growth mask set includes a plurality of epitaxial tiles; and (d) using the polysilicon deposition mask set and the epitaxial growth mask set to make a semiconductor device; wherein the epitaxial growth mask set is derived from the data set by using at least a portion of the tile pattern defined in the data set for at least a portion of the tile pattern defined in the epitaxial deposition mask set.

In another aspect, a method for making a semiconductor device is provided which comprises (a) providing a semiconductor stack comprising a semiconductor substrate, an SOI layer, and a dielectric layer disposed between the SOI layer and the substrate; (b) forming a first plurality of trenches in the SOI layer which expose portions of the dielectric layer, thereby defining a plurality of trench CMP tiles; (c) backfilling the first plurality of trenches with an oxide; (d) forming a second plurality of trenches which extend through the oxide and the dielectric layer and which expose portions of the substrate; (e) epitaxially growing the exposed portions of the substrate, thereby forming a plurality of epitaxial tiles; and (f) selectively depositing polysilicon over the epitaxial tiles, thereby forming a plurality of polysilicon tiles.

In a further aspect, a semiconductor device is provided which comprises (a) a semiconductor stack comprising a semiconductor substrate, an SOI layer, and a dielectric layer disposed between the SOI layer and the substrate; (b) a plurality of trench CMP tiles defined in the SOI layer; (c) a plurality of epitaxial tiles, wherein said plurality of epitaxial tiles do not overlap with said plurality of trench CMP tiles; and (d) a plurality of polysilicon tiles, wherein each of said plurality of polysilicon tiles is disposed over one of said plurality of epitaxial tiles.

It has now been found that the aforementioned needs in the art may be met through the provision of a tiling strategy in which a mask set used for polysilicon deposition and a mask set used for epitaxial growth are derived from the same data set. Preferably, this is accomplished by "reusing" the tiles defined in the data set for the polysilicon deposition mask to define some or all of the epitaxial growth tiles. Consequently, in a typical implementation, the polysilicon tiles will be disposed on top of the epitaxial tiles. Such an approach is especially useful when used in conjunction with trench chemical mechanical polishing (CMP) tiling algorithms.

Unlike tiling approaches known to the art in which a fraction of the tiles used for trench CMP are merely reused for density matching in epitaxy (a process which may require reconfiguration or re-optimization of the trench CMP mask), the approach described herein permits the needs of trench CMP to be decoupled from those of epitaxial growth processes, and avoids the need to reconfigure or re-optimize the trench CMP mask. For example, such an approach allows the epitaxial tiles to be oriented so as to favor certain desired growth rates and facets, thereby allowing silicon overburden and epitaxial CMP characteristics to be tailored independently of the needs imposed by trench CMP. Consequently, this approach allows both global and local pattern density effects to be adequately compensated for.

Moreover, since the polysilicon mask will typically already be designed to consider the placement of active data and other tiles in the device so as to avoid overlap, the use of the polysilicon mask to derive the epitaxial mask ensures that the positions selected for the epitaxial tiles are available for tiling. In addition, since the considerations affecting uniformity of polysilicon deposition are, in many cases, similar to those affecting epitaxial growth, the use of tiles designed to optimize polysilicon deposition will, in many cases, optimize, or come close to optimizing, epitaxy.

The methodology disclosed herein may be further appreciated with respect to FIGS. 1-9, which disclose a first particular, non-limiting embodiment of a process in accordance with the teachings herein. With reference to FIG. 1, a structure 201 is provided which comprises a substrate 203 which preferably comprises (110) silicon and upon which is disposed a buried oxide (BOX) layer 205 and an SOI layer 207, the later of which preferably comprises (100) silicon.

Figure 2:
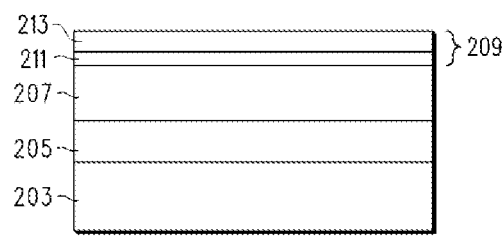
FIG. 2 is an illustration of a step in a semiconductor fabrication process in accordance with the teachings herein.
Figure 3:
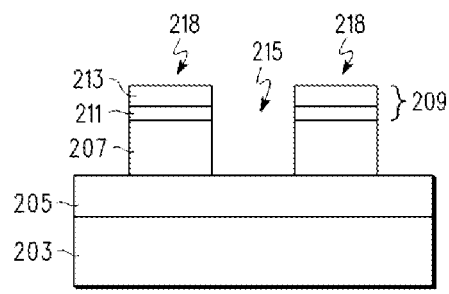
FIG. 3 is an illustration of a step in a semiconductor fabrication process in accordance with the teachings herein.

As shown in FIG. 2, a hard mask 209 is then formed over the structure. The hard mask 209 comprises a layer of oxide 211 over which is deposited a layer of nitride 213. As shown in FIG. 3, the hard mask 209 is then patterned to expose a portion of the underlying SOI layer 207, and the exposed portion of the SOI layer 207 is removed by etching to define a first trench 215 therein which extends to the BOX layer 205. The BOX layer 205 may be used as an etch stop in this process. In inactive regions of the device, the resulting structures 218 form by the etch are the CMP tiles.

Figure 4:
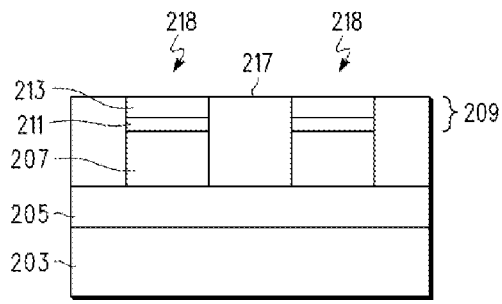
FIG. 4 is an illustration of a step in a semiconductor fabrication process in accordance with the teachings herein, and is a partial cross-section taken along LINE 4-4 of FIG. 11.

Referring now to FIG. 4, the first trench 215 is then backfilled with a suitable oxide 217. This oxide deposition is preferably followed by CMP so that the oxide 217 is coplanar with the hard mask 209.

Figure 5:
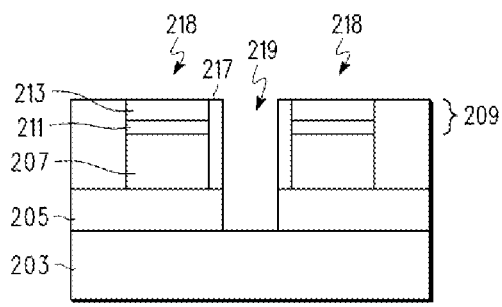
FIG. 5 is an illustration of a step in a semiconductor fabrication process in accordance with the teachings herein.

Next, as shown in FIG. 5, a second trench 219 is created within the backfilled oxide 217 which exposes a portion of the substrate 203. A suitable oxide etch may be used for this purpose. In inactive regions of the device, the exposed portions of the substrate form the epitaxial tiles.

Figure 6:
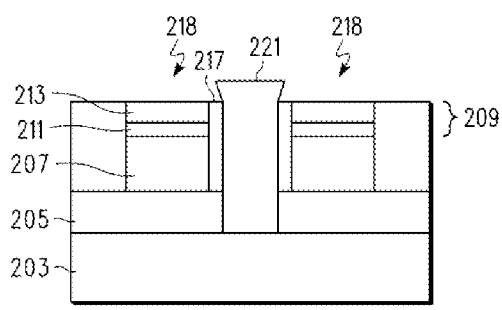
FIG. 6 is an illustration of a step in a semiconductor fabrication process in accordance with the teachings herein.

As shown in FIG. 6, the second trench 219 is then filled with epitaxial material 221 through epitaxial growth of the (110) substrate 203. The epitaxial material 221 is grown to a height above the masking layer 209. This height is referred to as the silicon overburden. During the epitaxial growth process, the backfilled oxide 217 within the trench prevents lateral growth of the SOI layer 207. In addition to ensuring the mono crystallinity of the resulting epitaxial material 221, this also prevents the formation of stress fracture regions which might otherwise form along intersections of the crystal propagation fronts.

Figure 7:
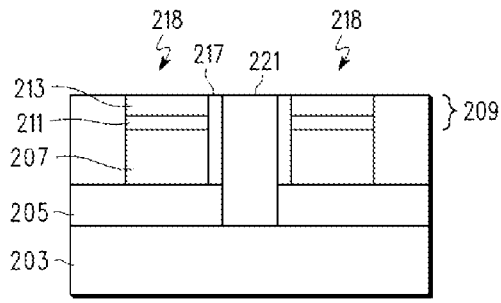
FIG. 7 is an illustration of a step in a semiconductor fabrication process in accordance with the teachings herein, and is a partial cross-section taken along LINE 7-7 of FIG. 12.
Figure 8:
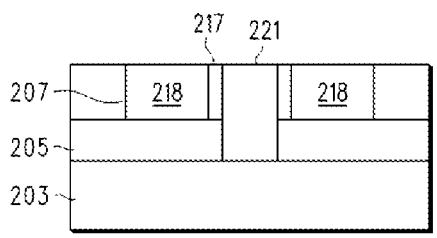
FIG. 8 is an illustration of a step in a semiconductor fabrication process in accordance with the teachings herein.

Referring now to FIG. 7, the epitaxial material 221 is subjected to CMP to planarize it with respect to the hard mask 209. The hard mask 209 is then stripped, and a portion of the exposed epitaxial material 221 is removed through a suitable etching process so that it is essentially planar with respect to the SOI silicon layer 207 as shown in FIG. 8. Such an etching process may comprise wet and/or dry etching or a combination of an oxidation and etching process.

Figure 9:
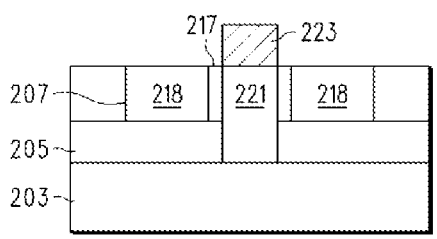
FIG. 9 is an illustration of a step in a semiconductor fabrication process in accordance with the teachings herein.

As shown in FIG. 9, the structure is then subjected to polysilicon deposition to define polysilicon features 233 thereon. In the inactive regions of the device, these polysilicon features 233 are in the form of polysilicon tiles that are disposed upon epitaxial tiles. Typically, these polysilicon features 233 will be formed through a suitable masking and deposition process.

Figure 10:
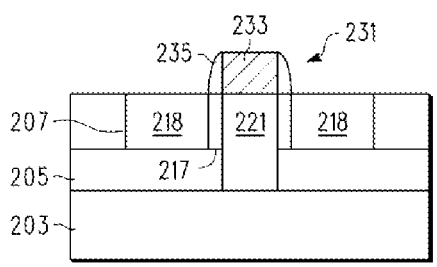
FIG. 10 is an illustration of a step in a semiconductor fabrication process in accordance with the teachings herein, and is a partial cross-section taken along LINE 10-10 of FIG. 13.

As shown in FIG. 10, the structure is then subjected to various processes typical of CMOS fabrication. These processes typically include the completion of gate structures 231, each of which will typically include a gate electrode 233 and spacer structures 235.

It will be appreciated that various modifications may be made to the foregoing process without departing from the scope of the teachings herein. For example, the hard masks used in the methodologies described herein may have various constructions and chemical compositions, and are not limited to oxide/nitride masks of the type depicted in the foregoing processes. In some embodiments, a suitable photo resist may be used in place of these hard masks. Moreover, the device may contain additional, or fewer, layers than those shown.

It will also be appreciated that the SOI silicon layer 207 and/or the silicon substrate 203 may be replaced in the foregoing process with germanium (Ge) or with silicon germanium (SiGe) alloys. Moreover, while it is preferred that the SOI silicon layer 207 has a (100) crystal orientation and that the substrate 203 has a (110) crystal orientation, the methodologies disclosed herein are not limited to any particular crystal orientation of either of these layers.

Figure 11:
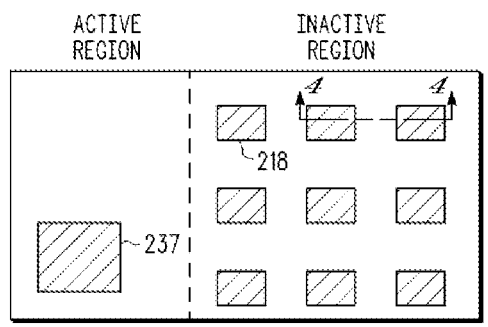
FIG. 11 is an illustration of a step in a semiconductor fabrication process in accordance with the teachings herein.
Figure 12:
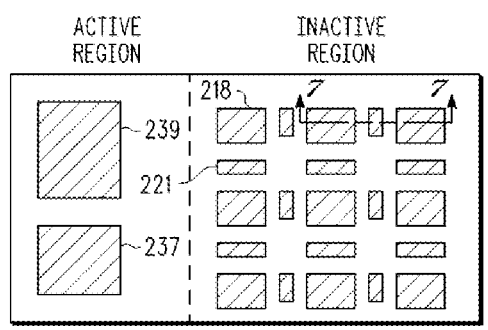
FIG. 12 is an illustration of a step in a semiconductor fabrication process in accordance with the teachings herein.
Figure 13:
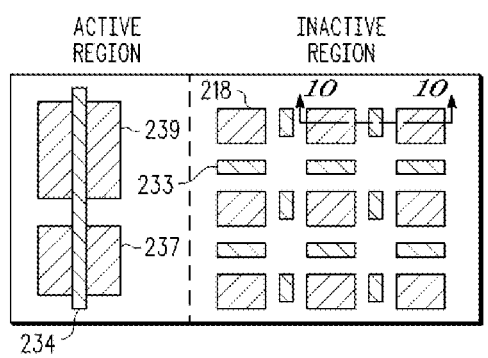
FIG. 13 is an illustration of a step in a semiconductor fabrication process in accordance with the teachings herein.

FIGS. 11-13 illustrate top views of a semiconductor device as it appears at different points in the process depicted in FIGS. 1-10. With reference to FIG. 11, the semiconductor device is shown as it appears after trench CMP has been completed. FIG. 4 corresponds to a partial cross-section of FIG. 11 taken along LINE 4-4. As seen therein, the successive steps of trench definition (with the use of a trench CMP mask set), trench backfill and CMP have defined an SOI feature 237 (which may be, for example, an NFET) in the active region of the device, and a plurality of trench CMP tiles 218 in the inactive region of the semiconductor device.

FIG. 12 depicts the device after epitaxial CMP has been completed. FIG. 7 corresponds to a partial cross-section of FIG. 12 taken along LINE 7-7. As seen therein, the successive steps of exposing portions of the substrate (with the use of an epitaxial mask set), epitaxial growth and CMP have defined feature 239 (which may be, for example, a bulk inverter) in the active region of the device, and a plurality of epitaxial tiles 221 in the inactive region of the semiconductor device.

FIG. 13 depicts the device after polysilicon deposition has been completed. FIG. 10 corresponds to a partial cross-section of FIG. 13 taken along LINE 10-10. As seen therein, polysilicon deposition with the use of a polysilicon mask set (which, in the particular embodiment depicted, is identical in the inactive region to the epitaxial mask set) has defined feature 234 (which may be, for example, a gate) in the active region of the device, and a plurality of polysilicon tiles 233 in the inactive region of the semiconductor device. In the particular embodiment depicted, each polysilicon tile in the inactive region is disposed over an epitaxial tile.

Figure 14:
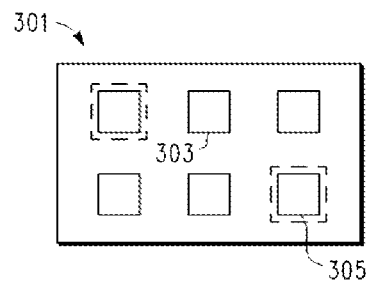
FIG. 14 is an illustration of an initial tiling data set with marker layers.
Figure 15:
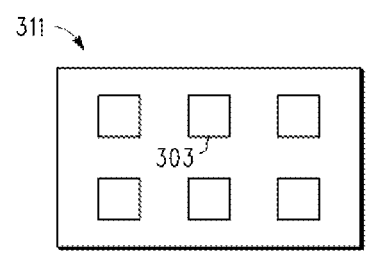
FIG. 15 is an illustration of a polysilicon mask set.
Figure 16:
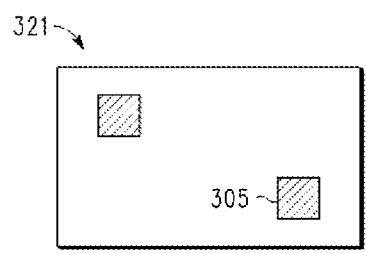
FIG. 16 is an illustration of an epitaxial mask set.
Figure 17:
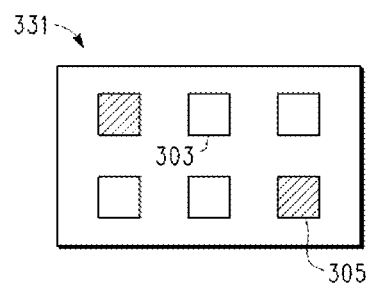
FIG. 17 is an illustration (top view) of a semiconductor device processed with the mask sets of FIGS. 15 and 16.

FIGS. 14-17 illustrate a particular, non-limiting embodiment of a tiling algorithm in accordance with the teachings herein. As shown in FIG. 14, a data set 301 is provided which defines a set of polysilicon tiles 303. As indicated by the dashed lines, a subset of the polysilicon tiles are selected for reuse as epitaxial tiles 305. The selection may be performed using a "marker layer" in the tiled database. The selected tiles 305 thus show up in both the polysilicon mask set 311 shown in FIG. 15, and the epitaxy mask set 321 shown in FIG. 16. The polysilicon mask set 311 and the epitaxial mask set 321 are formed by the use of proper Boolean operations on the tile data and the marker data to include data set features in both the polysilicon mask set 311 and in the epitaxial mask set 321. FIG. 17 depicts a top view of a semiconductor device (corresponding to the stage in the process depicted in FIG. 8) as it would appear if processed with the polysilicon mask set 307 and the epitaxial mask set 309.

In some embodiments of the methodology described herein, one or more of the trench CMP mask set, the epitaxial growth mask set or the polysilicon mask set may be re-optimized or reconfigured to account for the presence of features defined by one or more of the other mask sets. Such a step may involve changes in the orientation, dimensions and/or shape of tiles in one or more of the mask sets. One such embodiment is described below.

Figure 18:
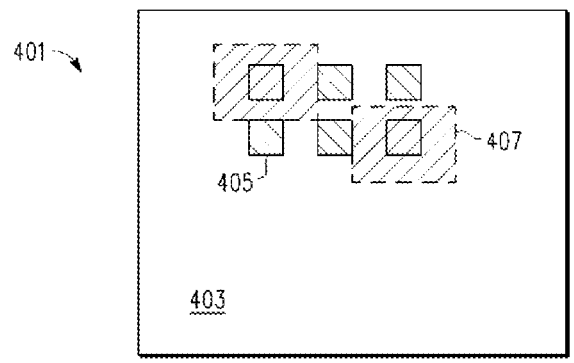
FIG. 18 illustrates the merging of tiles which can occur during epitaxy.

In designing a tiling scheme for epitaxial growth on a (110) bulk surface, lateral overgrowth is observed to happen at a faster rate than vertical growth. Moreover, the rate of overgrowth varies with direction, such that growth is preferred along certain crystallographic orientations. This phenomenon is depicted in FIG. 18. The structure 401 depicted therein comprises an SOI surface 403 upon which are disposed a plurality of STI CMP tiles 405 and a plurality of bulk epitaxial tiles 407. The dashed lines indicate the perimeter of the epitaxial tiles 407 after epitaxy. Depending on their proximity, it is thus possible for two epitaxial tiles 407 to merge during epitaxy, which can cause problems for the subsequent CMP.

Figure 19:
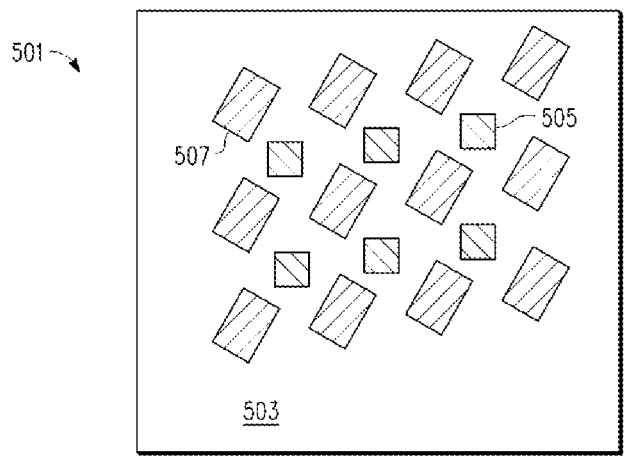
FIG. 19 illustrates a tiling strategy in which non-epitaxial tiles have been placed between epitaxial tiles to allow more room for overgrowth, and in which the orientation of the epitaxial tiles has been adjusted to effectively increase the distance between the epitaxial tiles in the direction of fastest growth.

One possible solution to this problem is illustrated in FIG. 19. The structure 501 depicted therein comprises an SOI surface 503 upon which are disposed a plurality of trench CMP tiles 505 and a plurality of bulk epitaxial tiles 507. However, in this embodiment, non-epitaxial tiles (in particular, the trench CMP tiles 505) have been placed between the epitaxial tiles 507, thereby allowing more room for overgrowth. Moreover, the orientation of the epitaxial tiles 507 has been adjusted to effectively increase the distance between the epitaxial tiles 507 in the direction of fastest growth. It will thus be appreciated that, by adjusting the orientation of the epitaxial tiles, the amount of silicon overburden may be tuned. Moreover, overgrowth issues and their impact on silicon CMP may be controlled by designing preferential facets into the overburden, as by orienting the epitaxial tiles along specific crystallographic orientations.

Although the methodologies and devices disclosed herein are described with reference to specific embodiments, various modifications and changes can be made without departing from the scope thereof as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor fabrication method, comprising:
    creating a data set which defines a set of tiles for a polysilicon deposition process;
    deriving a polysilicon deposition mask set from the data set, wherein the polysilicon deposition mask set includes a plurality of polysilicon tiles overlying inactive regions of a substrate;
    deriving an epitaxial growth mask set from the data set, wherein the epitaxial growth mask set includes a plurality of epitaxial tiles overlying inactive regions of a substrate; and
    using the polysilicon deposition mask set and the epitaxial growth mask set to make a semiconductor device;
    wherein the epitaxial growth mask set is derived from the data set by using at least a portion of the tile pattern defined in the data set for at least a portion of the tile pattern defined in the polysilicon deposition mask set;
    reconfiguring the epitaxial growth mask set, thereby defining a reconfigured epitaxial growth mask set;
    wherein reconfiguring the epitaxial growth mask set includes modifying an aspect of the tiles defined therein for an epitaxial process.

2. The method of claim 1, wherein the epitaxial growth mask set is derived from the data set by using the tile pattern defined therein for the polysilicon deposition mask set.

3. The method of claim 1, wherein the semiconductor device comprises a semiconductor substrate, an SOI layer, and a dielectric layer disposed between the SOI layer and the substrate.

4. The method of claim 3, wherein using the epitaxial growth mask set to make a semiconductor device comprises:
    using the epitaxial growth mask set to define a plurality of trenches, wherein each of the plurality of trenches exposes a portion of the substrate; and
    epitaxially growing the exposed portion of the substrate.

5. The method of claim 1, further comprising using a trench chemical mechanical polishing (CMP) mask set to make the semiconductor device, and wherein the trench CMP mask set comprises a plurality of trench CMP tiles.

6. The method of claim 5, wherein the plurality of epitaxial tiles are disposed in the spaces between the trench CMP tiles.

7. The method of claim 5, wherein the plurality of polysilicon tiles are disposed in the spaces between the trench CMP tiles.

8. The method of claim 1, wherein the polysilicon tiles are disposed on top of the epitaxial tiles.

9. The method of claim 1, wherein the epitaxial growth mask set is modified by changing the dimensions of at least some of the tiles defined therein.

10. The method of claim 5, wherein modifying the epitaxial growth mask set includes changing the dimensions of at least some of the tiles defined therein which are adjacent to tiles belonging to the CMP mask set.

11. The method of claim 5, wherein modifying the epitaxial growth mask set includes changing the orientation of at least some of the tiles defined therein which are adjacent to tiles belonging to the CMP mask set.

12. The method of claim 11 wherein, after the epitaxial growth mask is modified, at least some of the tiles in the epitaxial growth mask set are aligned along a first major axis, and wherein the first major axis is not parallel to a major axis of the trench CMP tiles in the trench CMP mask set.

13. The method of claim 1, wherein the semiconductor device is a CMOS device.

14. A method for making a semiconductor device, comprising:
  creating a data set which defines a set of tiles for a polysilicon deposition process;
  deriving a polysilicon deposition mask set from the data set, wherein the polysilicon deposition mask set includes a plurality of polysilicon tiles overlying inactive regions of a substrate;
  deriving an epitaxial growth mask set from the data set, wherein the epitaxial growth mask set includes a plurality of epitaxial tiles overlying inactive regions of a substrate; and
  using the polysilicon deposition mask set and the epitaxial growth mask set to make a semiconductor device;
  wherein the epitaxial growth mask set is derived from the data set by using at least a portion of the tile pattern defined in the data set for at least a portion of the tile pattern defined in the polysilicon deposition mask set; and
  wherein using the polysilicon deposition mask set and the epitaxial growth mask set to make a semiconductor device includes:
    providing a semiconductor stack comprising a semiconductor substrate, a silicon on insulator (SOI) layer, and a dielectric layer disposed between the SOI layer and the substrate;
    forming a first plurality of trenches in the SOI layer which expose portions of the dielectric layer, thereby defining a plurality of trench CMP tiles;
    filling the first plurality of trenches with an oxide;
    forming a second plurality of trenches which extend through the oxide and the dielectric layer and which expose portions of the substrate;
    using the epitaxial growth mask set to epitaxially grow the portions of the substrate exposed, thereby forming a plurality of epitaxial tiles; and
    using the polysilicon deposition mask set to selectively deposit polysilicon over the epitaxial tiles, thereby forming a plurality of polysilicon tiles.

15. The method of claim 14, wherein forming the first plurality of trenches in the SOI layer comprises:
  forming a hard mask over the SOI layer;
  patterning the hard mask to expose portions of the SOI layer; and
  etching the portions of the SOI layer exposed by the patterning of the hard mask.

16. The method of claim 15, wherein the dielectric layer is used as an etch stop during etching of the SOI layer.

17. The method of claim 15, wherein portions of the second plurality of trenches which extend through the SOI layer are lined with oxide.

* * * * *